United States Patent
Minami et al.

(10) Patent No.: US 10,580,676 B2
(45) Date of Patent: Mar. 3, 2020

(54) ROBOT SYSTEM AND CARRYING METHOD

(71) Applicant: KABUSHIKI KAISHA YASKAWA DENKI, Kitakyushu-shi (JP)

(72) Inventors: Takashi Minami, Kitakyushu (JP); Yoshiki Kimura, Kitakyushu (JP)

(73) Assignee: KABUSHIKI KAISHA YASKAWA DENKI, Kitakyushu-Shi (JP)

(*) Notice: Subject to any disclaimer, the term of this patent is extended or adjusted under 35 U.S.C. 154(b) by 294 days.

(21) Appl. No.: 15/451,411

(22) Filed: Mar. 7, 2017

(65) Prior Publication Data

US 2017/0178938 A1 Jun. 22, 2017

Related U.S. Application Data

(63) Continuation of application No. PCT/JP2014/073653, filed on Sep. 8, 2014.

(51) Int. Cl.
*H01L 21/677* (2006.01)
*B25J 9/00* (2006.01)
(Continued)

(52) U.S. Cl.
CPC ...... *H01L 21/67706* (2013.01); *B25J 9/0027* (2013.01); *B25J 9/0087* (2013.01);
(Continued)

(58) Field of Classification Search
CPC ........ B25J 9/0027; B25J 9/0087; B25J 9/042; B25J 9/043; B25J 11/0095; B25J 15/0052;
(Continued)

(56) References Cited

U.S. PATENT DOCUMENTS 5,664,254 A 9/1997 Ohkura et al.
5,789,890 A * 8/1998 Genov .................. B25J 9/1615
318/567
(Continued)

FOREIGN PATENT DOCUMENTS

JP 08-274140 10/1996
JP 08-274143 10/1996
(Continued)

OTHER PUBLICATIONS

Japanese Office Action for corresponding JP Application No. 2016-547266, dated Oct. 10, 2017 (w/ English machine translation).
(Continued)

*Primary Examiner* — Saul Rodriguez
*Assistant Examiner* — Brendan P Tighe
(74) *Attorney, Agent, or Firm* — Mori & Ward, LLP

(57) ABSTRACT

A robot system includes a robot including a first hand, a second hand, an arm mechanism, and an elevator. The first hand is to hold a substrate. The second hand is to hold the substrate. The arm mechanism supports the first hand and the second hand to provide a height difference between the first hand and the second hand in a height direction of the robot. The elevator is to move the arm mechanism in the height direction within a moving range larger than the height difference. Both the first hand and the second hand put the substrate in the holder. Circuitry is configured to control the robot to move the arm mechanism in the height direction by the elevator to pass the substrate from the first hand to the second hand via the holder.

14 Claims, 9 Drawing Sheets

(51) Int. Cl.
  *B25J 18/02* (2006.01)
  *B25J 9/04* (2006.01)
  *B25J 11/00* (2006.01)
  *H01L 21/687* (2006.01)
(52) U.S. Cl.
  CPC ........... *B25J 9/043* (2013.01); *B25J 11/0095* (2013.01); *B25J 18/025* (2013.01); *H01L 21/67742* (2013.01); *H01L 21/68707* (2013.01)
(58) Field of Classification Search
  CPC .............. B25J 18/025; H01L 21/67706; H01L 21/67742; H01L 21/68707
  USPC ....................................................... 414/744.3
  See application file for complete search history.

(56) References Cited

U.S. PATENT DOCUMENTS

| | | | |
|---|---|---|---|
| RE37,470 E | 12/2001 | Ohkura et al. | |
| 7,357,842 B2* | 4/2008 | Ishikawa | G03B 27/32 |
| | | | 118/50 |
| 7,699,021 B2* | 4/2010 | Volfovski | G03B 27/32 |
| | | | 118/50 |
| 8,562,275 B2* | 10/2013 | Hiroki | H01L 21/67742 |
| | | | 118/719 |
| 2002/0020355 A1 | 2/2002 | Saeki et al. | |
| 2003/0136515 A1 | 7/2003 | Saeki et al. | |
| 2004/0216475 A1 | 11/2004 | Sasaki et al. | |
| 2008/0166208 A1* | 7/2008 | Lester | H01L 21/67051 |
| | | | 414/217 |
| 2013/0184862 A1* | 7/2013 | Ando | H01L 21/67766 |
| | | | 700/245 |
| 2016/0167229 A1* | 6/2016 | Hosek | B25J 9/042 |
| | | | 700/248 |

FOREIGN PATENT DOCUMENTS

| | | |
|---|---|---|
| JP | 2000-208589 | 7/2000 |
| JP | 2004-288718 | 10/2004 |
| JP | 2007-210757 | 8/2007 |
| WO | WO 2009/066573 | 5/2009 |

OTHER PUBLICATIONS

International Search Report for corresponding International Application No. PCT/JP2014/073653, dated Nov. 25, 2014.

\* cited by examiner

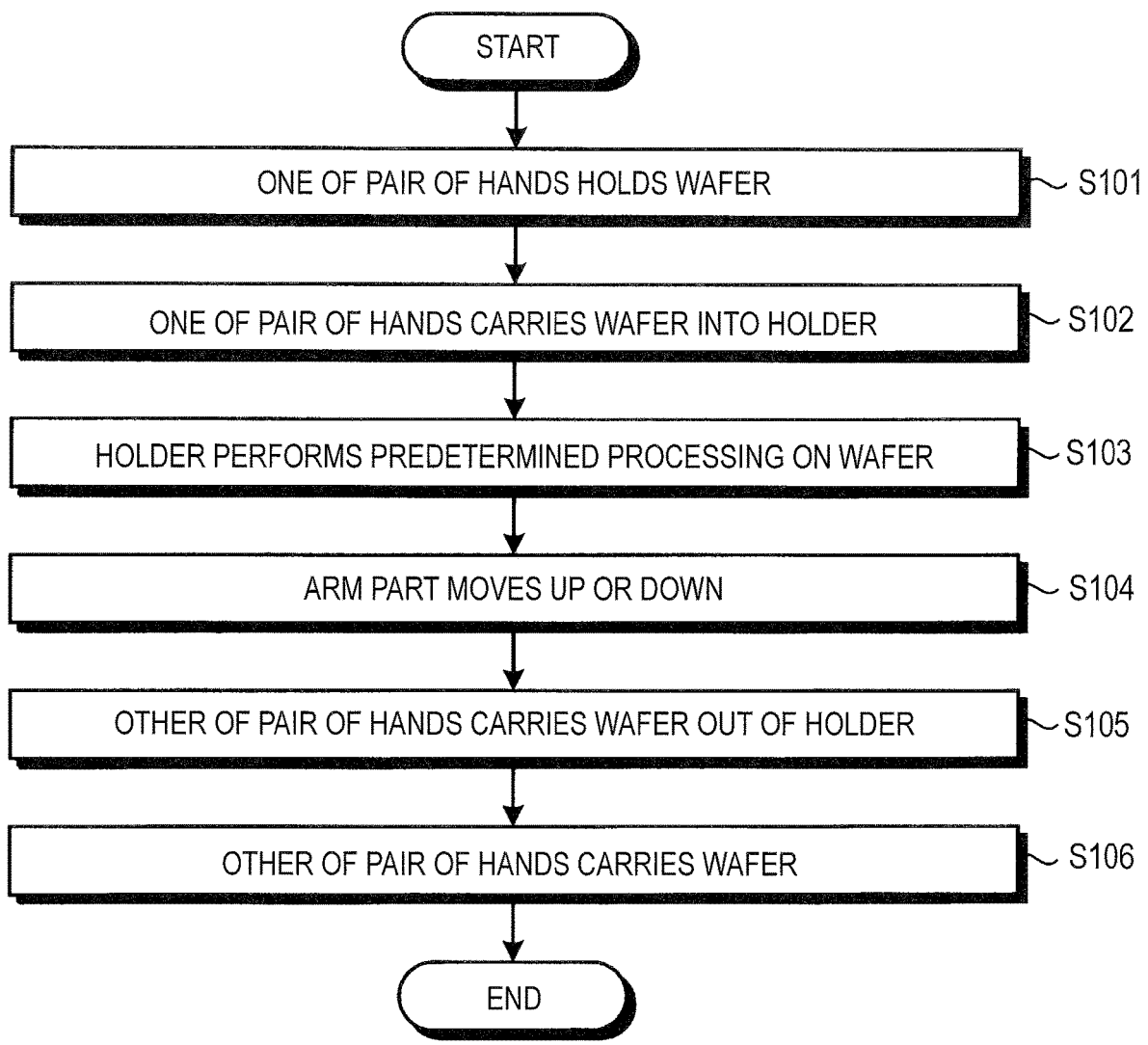

US 10,580,676 B2

ROBOT SYSTEM AND CARRYING METHOD

The present disclosure contains subject matter related to that disclosed in International Patent Application PCT/JP 2014-073653 filed in the Japan Patent Office on Sep. 8, 2014, the entire contents of which are hereby incorporated by reference.

BACKGROUND

Field of the Invention

The embodiments disclosed herein relate to a robot system and a carrying method.

Description of the Related Art

In related art, a robot system having a horizontal articulated robot provided in a space formed within a local clean apparatus is known. The horizontal articulated robot carries substrates such as wafers into and out of a cassette for housing substrates or a processing apparatus used for a semiconductor manufacturing process.

Further, as the robot system, a substrate carrier system combining a horizontal articulated robot without an elevating mechanism with a cassette having the elevating mechanism is known (for example, see JP-A-8-274140).

SUMMARY

According to one aspect of the embodiments, a robot system includes a robot, a holder, and circuitry. The robot includes a first hand, a second hand, an arm mechanism, and an elevator. The first hand is to hold a substrate. The second hand is to hold the substrate. The arm mechanism supports the first hand and the second hand to provide a height difference between the first hand and the secondhand in a height direction of the robot. The elevator is to move the arm mechanism in the height direction within a moving range larger than the height difference. Both the first hand and the second hand put the substrate in the holder. The circuitry is to control the robot to move the arm mechanism in the height direction by the elevator to pass the substrate from the first hand to the second hand via the holder.

BRIEF DESCRIPTION OF THE DRAWINGS

FIG. 7 is a flowchart showing processing procedures executed by the robot system.

DESCRIPTION OF THE EMBODIMENTS

The embodiments of a robot system and a carrying method disclosed in this application will be explained in details with reference to the accompanying drawings.

Figure 1:
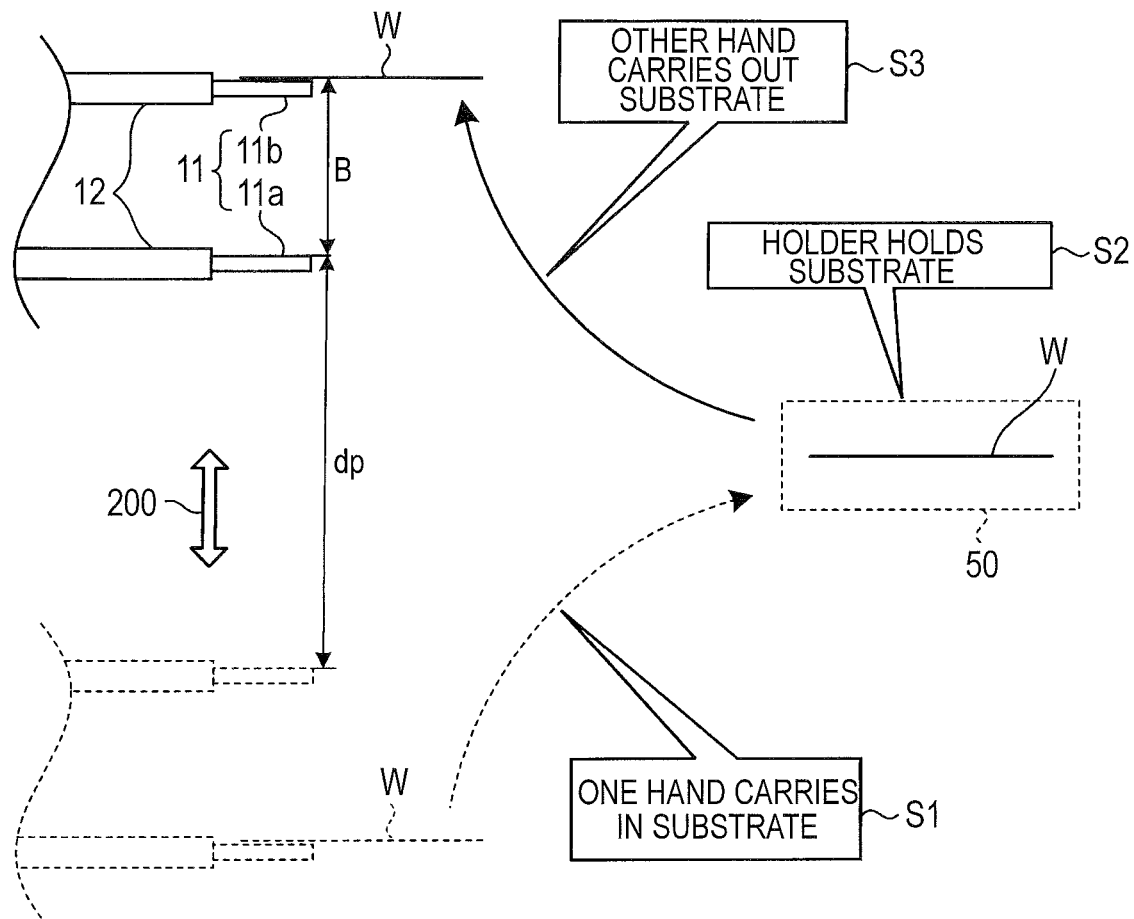
FIG. 1 is a schematic view showing a carrying method according to an embodiment.

First, the carrying method according to the embodiment will be explained in FIG. 1. FIG. 1 is a schematic view showing the carrying method according to the embodiment. For the sake of convenience of comprehension, a three-dimensional orthogonal coordinate system including a Z-axis extending in a vertical upward positive direction and a vertical downward negative direction (i.e., "vertical direction") is shown in FIG. 1.

Further, the Z-axis directions shown in the drawing may be referred to as height directions, and the positive direction of the Z-axis with respect to an object may be referred to as "upside" and the negative direction may be referred to as "downside". FIG. 1 schematically shows arm mechanism 12 that supports a pair of hands 11 at different heights etc. as seen from a side surface, i.e., from a negative direction of a Y-axis shown in the drawing.

The carrying method shown in FIG. 1 is used for handing over and carrying a substrate W between the pair of hands 11 via a holder 50. As shown in FIG. 1, the robot system according to the embodiment includes the arm mechanism 12, a robot (not shown), and the holder 50.

The arm mechanism 12 supports the pair of hands 11 that respectively hold the substrate W at different heights. In FIG. 1, the pair of hands 11 includes a lower hand 11a on the downside with respect to the height direction, and an upper hand 11a on the upside with respect to the height direction. The difference in height between the pair of hands 11 is indicated as "distance B".

The robot has an elevator (not shown) that moves up and down the arm mechanism 12 in an elevation range (a moving range) larger than the height difference between the pair of hands 11. The elevator moves up and down the arm mechanism 12 in a longer distance than the distance B along the Z-axis directions illustrated in the drawing (see an arrow 200 in FIG. 1).

The arm mechanism 12 is moved up and down in the above described manner, and thereby, a range in which ranges reached by the lower hand 11a and the upper hand 11b in the height direction overlap may be provided (see "overlap range dp" in FIG. 1). The details of the point will be described later with FIG. 5.

The holder 50 holds the substrate W in the overlap range dp. Then, the robot hands over the substrate W between the pair of hands 11 via the holder 50 while moving up and down the arm mechanism 12.

As below, the handover of the substrate W between the pair of hands 11 in the carrying method according to the embodiment will be explained more specifically. The case where the substrate W is handed over from the lower hand 11a to the upper hand 11b will be explained below as an example.

As shown in FIG. 1, for example, the arm mechanism 12 carries the substrate W held by the lower hand 11a into the holder 50 while moving in the positive direction of the Z-axis shown in the drawing (see step S1 in FIG. 1). Then, the holder 50 holds the substrate W (see step S2 in FIG. 1).

Subsequently, the upper hand 11b carries the substrate W out of the holder 50 while the arm mechanism 12 moves in the negative direction of the Z-axis shown in the drawing, and carries the substrate W to a carrying destination reachable by the upper hand 11b (see step S3 in FIG. 1).

Further, in FIG. 1, the case where the substrate W is handed over from the lower hand 11a to the upper hand 11b is explained as an example, however, the substrate W may be handed over from the upper hand 11b to the lower hand 11a.

As described above, in the carrying method according to the embodiment, the handover of the substrate W between the pair of hands 11 is performed via the holder 50. Thereby, the elevation range of the elevator can be made smaller than an elevation range required for the handover without being performed via the holder 50. In other words, the carrying range of the substrate W can be expanded without increase of the elevation range of the elevator compared to the case not via the holder 50. Therefore, according to the carrying method of the embodiment, space efficiency of the facilities may increase.

In FIG. 1, two arms are exemplary used for supporting the pair of hands 11. However, instead of the arm mechanism 12, a single arm may be alternatively employed to support the pair of hands 11.

As long as the pair of hands 11 may hold the substrate W at the distance B in the height directions, any positional relationship can be determined between the hands in the XY-plane directions in the drawing. In this case, a turning mechanism that turns the arm mechanism 12 about an axis parallel to the height directions may be provided.

Figure 2:
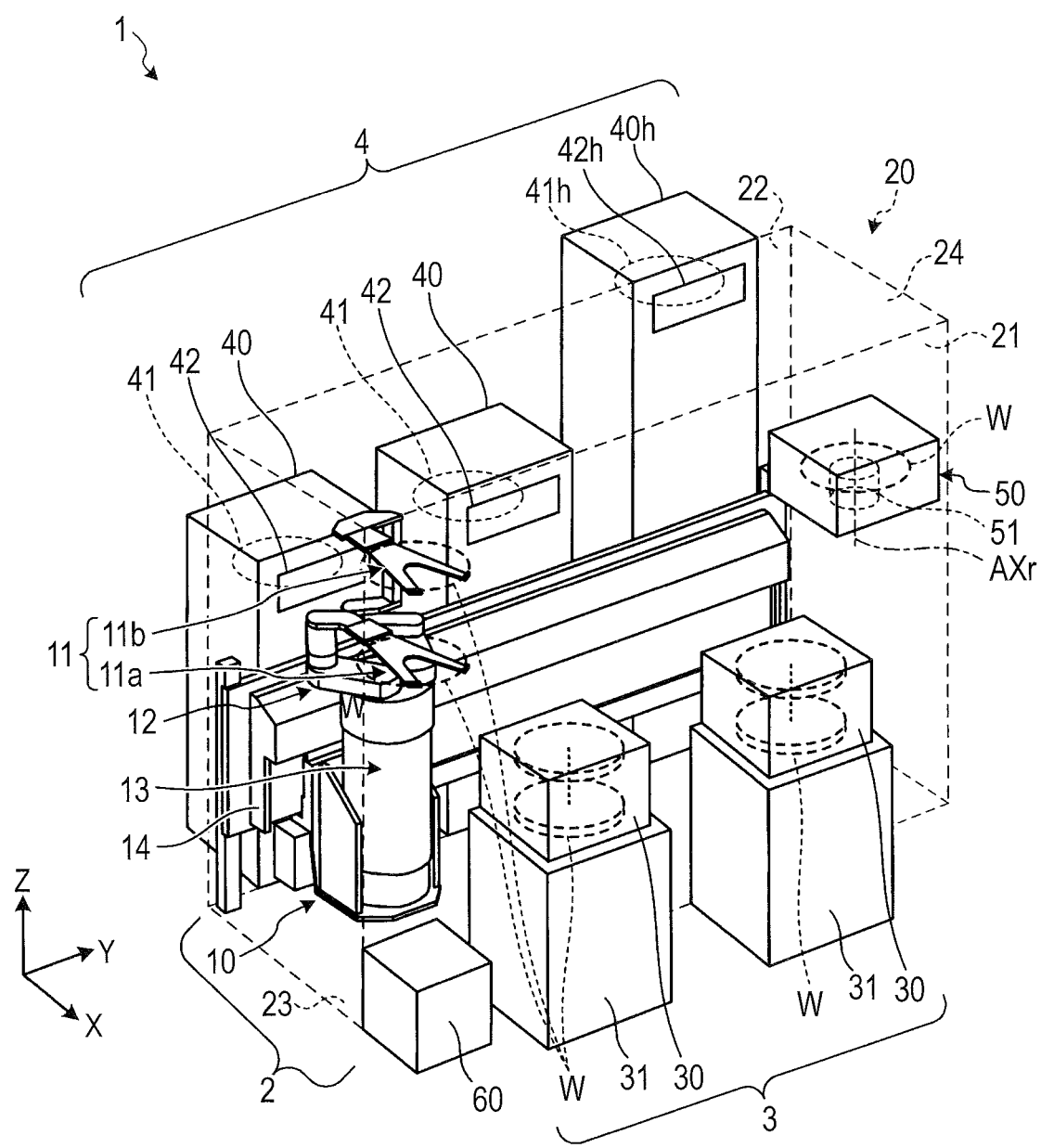
FIG. 2 is a perspective schematic view showing a layout of a robot system.

Next, a robot system 1 according to the embodiment will be explained. FIG. 2 is a perspective schematic view showing a layout of the robot system 1. For the sake of convenience, a three-dimensional orthogonal coordinate system including a Z-axis extending in a vertical upward positive direction and a vertical downward negative direction (i.e., "vertical direction") is shown in FIG. 2.

Accordingly, directions along the XY-plane refer to "horizontal directions" and the positive direction of the Z-axis refers to "height direction". The orthogonal coordinate system may be shown in the other drawings used for the following explanation. Further, the positive direction of the Z-axis with respect to an object may be referred to as "upside" and the negative direction may be referred to as "downside". Furthermore, as below, the positive direction of the X-axis is determined as "forward" and the positive direction of the Y-axis is determined as "leftward".

In FIG. 2, for ease of comprehension of the internal configuration of the robot system 1, a housing 20 is shown in a perspective view. Here, the case of two hoops 30 and three processing chambers 40 is taken as an example, however, the numbers of the hoops 30 and the processing chambers 40 are not limited.

As shown in FIG. 2, the robot system 1 includes a substrate carrier 2, a substrate feeder 3, and a substrate processor 4. The substrate carrier 2 includes a robot 10, the housing 20 in which the robot 10 is placed, and the holder 50. The substrate feeder 3 is provided on one side surface 21 of the housing 20 and the substrate processor 4 is provided on the other side surface 22.

The housing 20 is the so-called EFEM (Equipment Front End Module) that forms a downflow of clean air via a filter unit (not shown) provided on the upside of the top surface and keeps the interior in a high clean level condition. Further, a lower surface of a bottom wall part 23 is provided with a predetermined clearance from the floor surface via legs (not shown).

The robot 10 includes the pair of hands 11 that can respectively hold a wafer (corresponding to "substrate" in FIG. 1) W to be carried, the arm mechanism 12 that is provided in a pair as dual arms (a pair of hand positioning mechanisms), and a trunk part 13 that supports the arm mechanism 12.

The pair of hands 11 are supported by the arm mechanism 12 at the distance B, which will be described later, between each other in the height directions. In FIG. 2, of the pair of hands 11, the hand on the downside is shown as the lower hand 11a and the hand on the upside is shown as the upper hand 11a.

The trunk part 13 is provided to be movable up and down with respect to the bottom wall part 23 of the housing 20 and turnable in the horizontal directions. In other words, the robot 10 is a horizontal articulated robot including two elevatable arms that turn in the horizontal directions. The details of the robot 10 will be described later using FIG. 3A and the subsequent drawings.

Further, in the housing 20, a mover 14 that movably supports the robot 10 in the Y-axis directions shown in the drawing. Furthermore, the holder 50 is provided on the inner wall or close to the inner wall of the housing 20 in the -axis directions shown in the drawing.

In the embodiment, the case where the holder 50 is a pre-aligner apparatus that centers the wafer W and the holder 50 is provided on an inner wall 24 of the housing 20 located on the positive direction side of the Y-axis shown in the drawing is shown as an example. However, the holder 50 may be provided apart from the inner wall 24 instead.

The pre-aligner apparatus (holder 50) has a table 51 on which the wafer W is mounted at the heights that can be respectively reached by the pair of hands 11. The table 51 is provided rotatably about an axis AXr parallel to the Z-axis shown in the drawing.

As described above, the holder 50 is provided closer to the side wall of the housing 20 in the movement direction of the robot 10, and thereby, interferences of the pair of hands 11 and the arm mechanism 12 moved by the mover 14 with the holder 50 may be avoided.

The holder 50 may hold the wafer W at the heights that can be respectively reached by the pair of hands 11. Therefore, the holder 50 may be a buffer that temporarily holds the wafer W or a temperature controller that heats or cools the wafer W, and the substrate carrier 2 may have a plurality of the holders 50.

The substrate feeder 3 includes the hoops 30 for housing a plurality of wafers W in multiple stages in the height directions, supports 31 that support the hoops 30, and hoop openers (not shown) that open and close lid members of the hoops 30 so that the wafers W may be ejected into the housing 20. FIG. 2 shows the case where the hoops 30 house the wafers W in the range that can be reached by the lower hand 11a.

The substrate processor 4 includes the processing chambers 40 having stages 41 on which the wafers W to be processed are mounted inside. Here, processors (not shown) that perform predetermined processing on the wafers W are provided within the processing chambers 40.

The processors may include e.g. a sputtering apparatus, CVD (Chemical Vapor Deposition) apparatus, etching apparatus, aching apparatus, and cleansing apparatus. The processors cited here are just examples.

Further, the processing chamber 40 includes a carrying window 42 communicating with the housing 20. The carrying window 42 is used for carrying in of the wafer W from the housing 20 to the processing chamber 40 and carrying out of the wafer W from the processing chamber 40 to the housing 20. The carrying window 42 is closed by a shutter (not shown).

The processing chambers 40 include one having the stage 41 and the carrying window 42 at the height that can be reached by the upper hand 11*b*. In FIG. 2, the processing chamber 40 etc. that can be reached by the upper hand 11*b* are shown as a processing chamber 40*h*, a stage 41*h*, and a carrying window 42*h*. Further, the processing chambers 40, 40*h* are provided on the other side surface 22 of the housing 20 to face the substrate feeder 3 with the robot 10 in between.

Here, the case where the substrate feeder 3 and the substrate processor 4 are provided to be opposed is explained as an example. However, for example, the substrate feeder 3 and the substrate processor 4 may be provided in an arbitrary position relationship such that the substrate feeder and the substrate processor are provided side by side on one side surface of the housing 20 or respectively provided on two side surfaces not to be opposed instead.

Further, the robot system 1 includes a control apparatus 60 outside of the housing 20. The control apparatus 60 includes various controllers, arithmetic processing units, memory devices, etc., and is connected to various apparatuses such as the robot 10 and the holder 50 to communicate information. The details of the control apparatus 60 will be described later using FIG. 4.

Thereby, for example, the robot 10 carries the wafer W before processing from the hoop 30 to the holder 50 (pre-aligner apparatus) using the lower hand 11*a* and carries the wafer W after centering from the holder 50 to the processing chamber 40*h* using the upper hand 1ib.

Here, the control apparatus 60 having the single casing is shown, however, the control apparatus may include a plurality of casings respectively associated with various apparatuses to control. Further, the control apparatus 60 may be provided within the housing 20.

As described above, in the robot system 1 according to the embodiment, in the carrying route of the wafers W, for example, an apparatus such as the pre-aligner apparatus that the robot system 1 originally has is also used as the holder 50.

Thereby, the carrying range of the wafers W in the height directions can be simply and easily expanded without changes in the facility including addition of new apparatuses and increase of an elevation range of an elevating mechanism, which will be described later, of the trunk part 13.

Therefore, according to the robot system 1 of the embodiment, the carrying range of the wafers W covering the long stroke of the elevating mechanism in the case without the holder 50 may be easily achieved by the simple configuration.

Figure 3A:
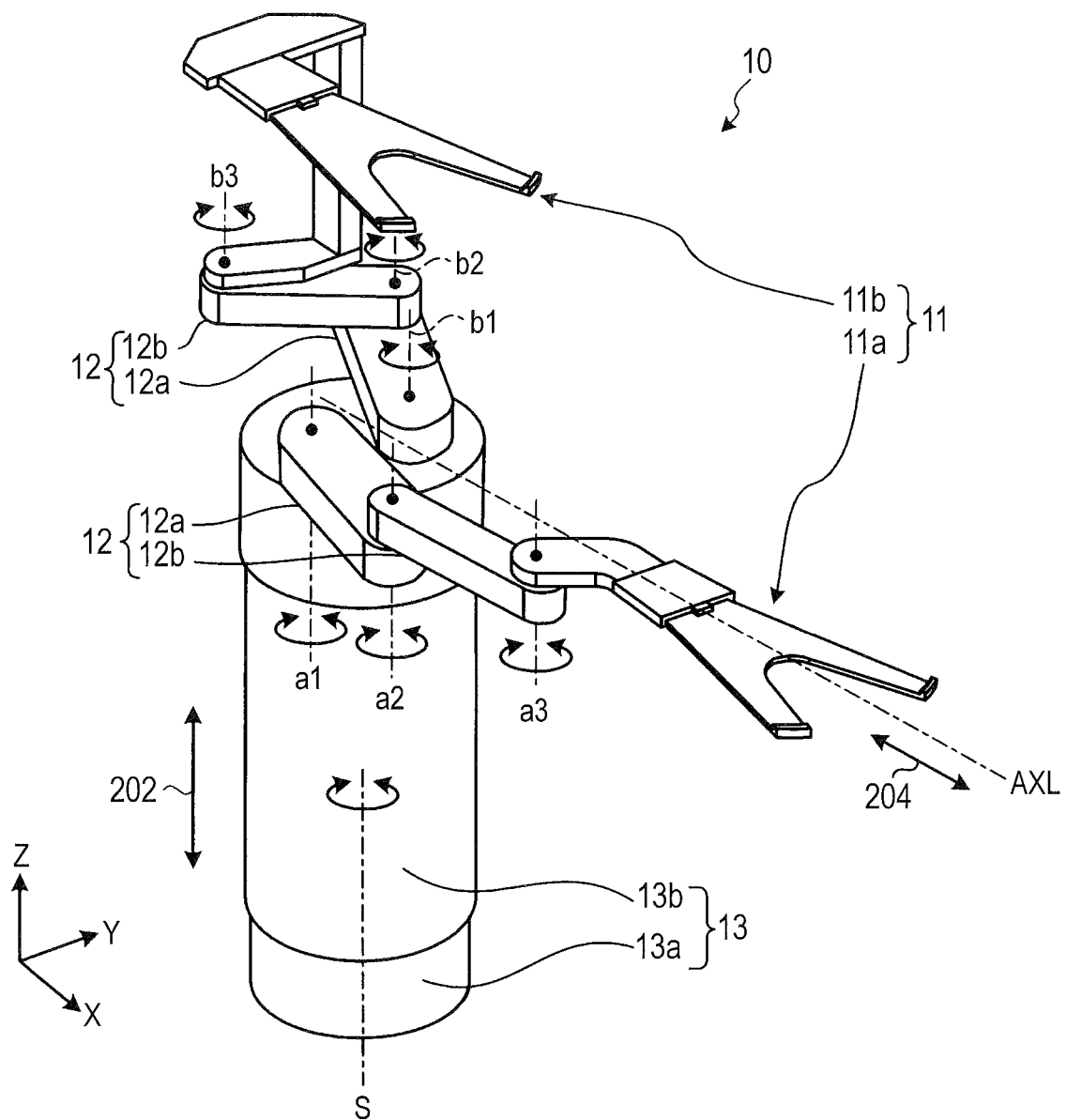
FIG. 3A is a perspective schematic view showing a configuration of a robot.

Next, a configuration of the robot 10 according to the embodiment will be explained using FIG. 3A. FIG. 3A is a perspective schematic view showing the configuration of the robot 10. As below, the case where the pair of hands 11 move forward and backward in the X-axis directions will be explained as an example.

As shown in FIG. 3A, the robot 10 includes the pair of hands 11, the arm mechanism 12, and the trunk part 13. The trunk part 13 includes a base 13*a* supported by the mover 14 (see FIG. 2) to be movable in the Y-axis directions shown in the drawing, and an arm base 13*b* that supports the arm mechanism 12.

The base 13*a* has a turning mechanism and an elevating mechanism (not shown), and supports the arm base 13*b* to be turnable about an axis S in the vertical directions (see a double-headed arrow about the axis S in FIG. 3A) and movable up and down in the vertical directions (see an arrow 202 in FIG. 3A).

The arm mechanism 12 includes a pair of horizontal arms provided as dual arms and each arm has a first arm 12*a* and a second arm 12*b*. As below, of the dual arms of the arm mechanism 12, one corresponding to the right arm will be explained as an example and the duplicated explanation of the other corresponding to the left arm will be omitted.

As shown in FIG. 3A, the first arm 12*a* has a proximal end portion coupled to the arm base 13*b* to be rotatable about an axis a1 (see a double-headed arrow about the axis a1 in FIG. 3A). The second arm 12*b* has a proximal end portion coupled to a distal end portion of the first arm 12*a* to be rotatable about an axis a2 (see a double-headed arrow about the axis a2 in FIG. 3A).

The lower hand 11*a* has a proximal end portion coupled to a distal end portion of the second arm 12*b* to be rotatable about an axis a3 (see a double-headed arrow about the axis a3 in FIG. 3A). FIG. 3A shows rotation axes of the left arm of the arm mechanism 12 corresponding to the axes a1to a3 as axes b1 to b3.

FIG. 3A shows the case where the lower hand 11*a* linearly moves along the X-axis shown in the drawing while restricting the orientation of the distal end in a fixed direction as an example (see an arrow 204 in FIG. 3A). Note that, in FIG. 3A, the track of the lower hand 11*a* is shown as an axis AXL.

The upper hand 11*b* is supported by the arm part 12 similarly to the lower hand 11*a*, and moves along the axis line located on the upside of the axis AXL, for example. As below, the details of the pair of hands 11 including the point will be explained with FIG. 3B.

Figure 3B:
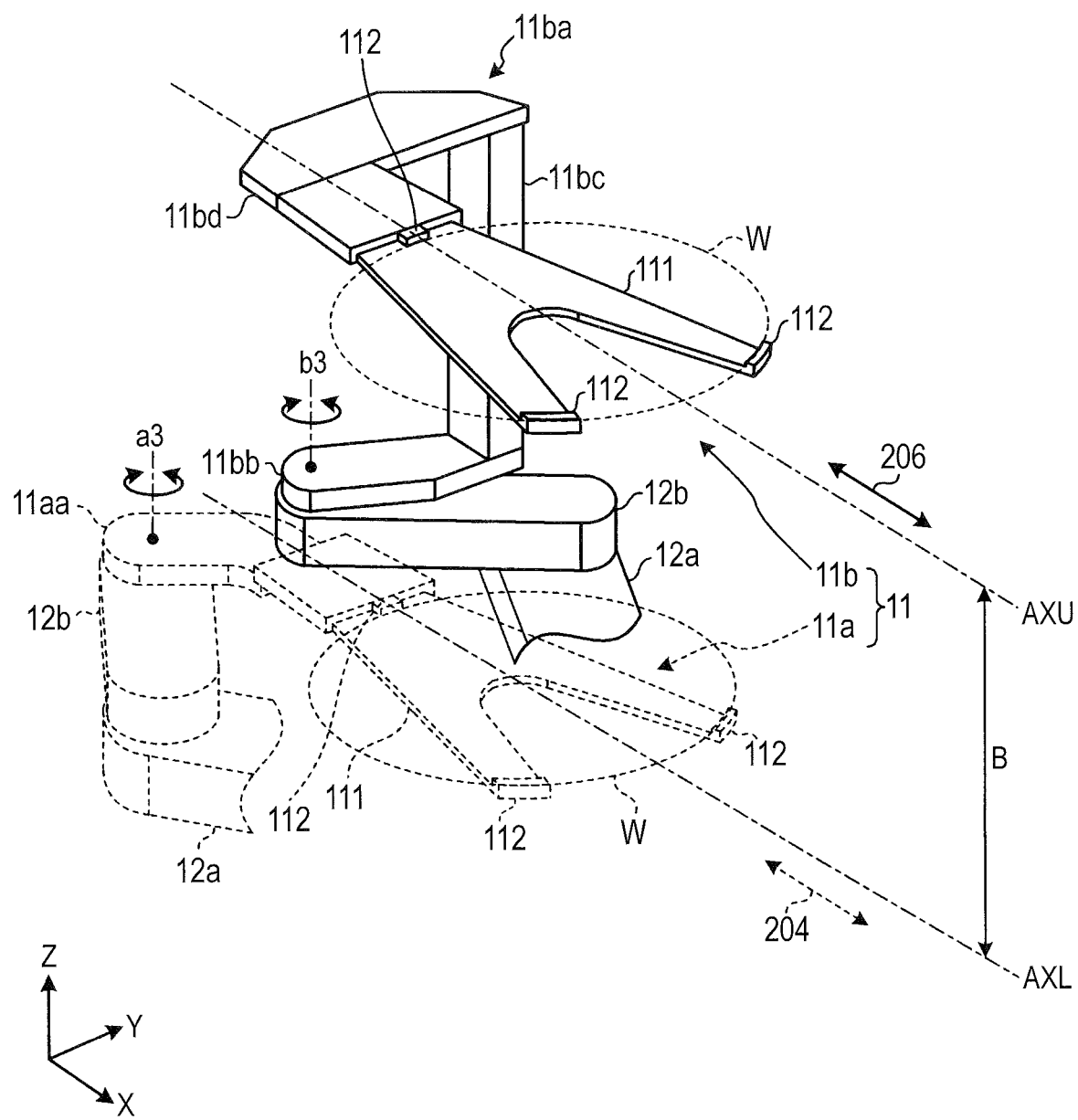
FIG. 3B is a perspective schematic view showing a configuration of a pair of hands.

FIG. 3B is a perspective schematic view showing the configuration of the pair of hands 11. In FIG. 3B, the lower hand 11*a* etc. when located immediately below the upper hand 11*b* are shown by dotted lines. Note that, as below, the upper hand 11*b* of the pair of hands 11 will be explained as an example, and the parts in the lower hand 11*a* in common with the upper hand 11*b* will have the same signs and the duplicated explanation will be omitted.

As shown in FIG. 3B, the upper hand 11*b* has a supporting portion 11*ba*, a plate 111, and engaging portions 112. The plate 111 is supported by the supporting portion 11*ba* and moves along an axis AXU located above at a fixed distance (distance B) from the axis AXL (see an arrow 206 in FIG. 3B).

Specifically, the supporting portion 11*ba* has brackets 11*bb*, 11*bd* and a coupling member 11*bc* extending in the vertical directions. The proximal end portion of the bracket 11*bb* is provided rotatably about the axis b3 in the distal end portion of the second arm 12*b*.

The coupling member 11*bc* is attached to the distal end portion of the bracket 11*bb* at a predetermined distance from the axis AXL in the positive direction of the Y-axis shown in the drawing. The proximal end portion of the bracket 11*bd* is attached to the other end portion of the coupling member 11*bc*. Then, the bracket 11*bd* holds the plate 111 in the distal end portion. The plate 111 is a member as a base portion of the upper hand 1ib.

Further, the lower hand 11*a* has a plate 111 and a supporting portion 11*aa* that supports the plate 111. The supporting portion 11*aa* is rotatable about the axis a3 in the distal end portion of the second arm 12*b*. Then, the lower hand 11*a* moves forward and backward on the axis AXL (see an arrow 204 in FIG. 3B) as has been explained with FIG. 3A.

The engaging portions 112 are members that engage and hold the wafer W on the plate 111. FIG. 3B shows the wafer W held by the respective pair of hands 11 by a dotted line. In the embodiment, three of the engaging portions 112 are provided in positions shown in FIG. 3B for each plate 111 and engage and hold the wafer W at three points.

Note that the number of engaging portions 112 is optional, but may be four or more. Further, FIG. 3B exemplifies the plate 111 in a shape with a bifurcated distal end, however, the shape of the plate 111 is not limited.

As described above, in the robot 10 according to the embodiment, with respect to the pair of horizontal arms (arm mechanism 12) respectively provided at the same height, the distance B in the height directions is provided between the pair of hands 11 by the coupling member 11bc extending in the vertical directions.

Thereby, the members forming the arm mechanism 12 and the pair of hands 11 can be used in common with each other and one of the dual arms of the arm mechanism 12 can be manufactured with slight alterations of the other. Therefore, the manufacturing cost of the robot 10 may be reduced.

Further, in the pair of hands 11 according to the embodiment, the coupling member 11bc is provided at the predetermined distance from the axis AXL in the positive direction of the Y-axis shown in the drawing. Thereby, interferences of the wafer W held by the lower hand 11a with the coupling member 11bc can be avoided and the respective arms of the arm mechanism 12 can be provided close to each other. The robot 10 is thus downsized.

Figure 4:
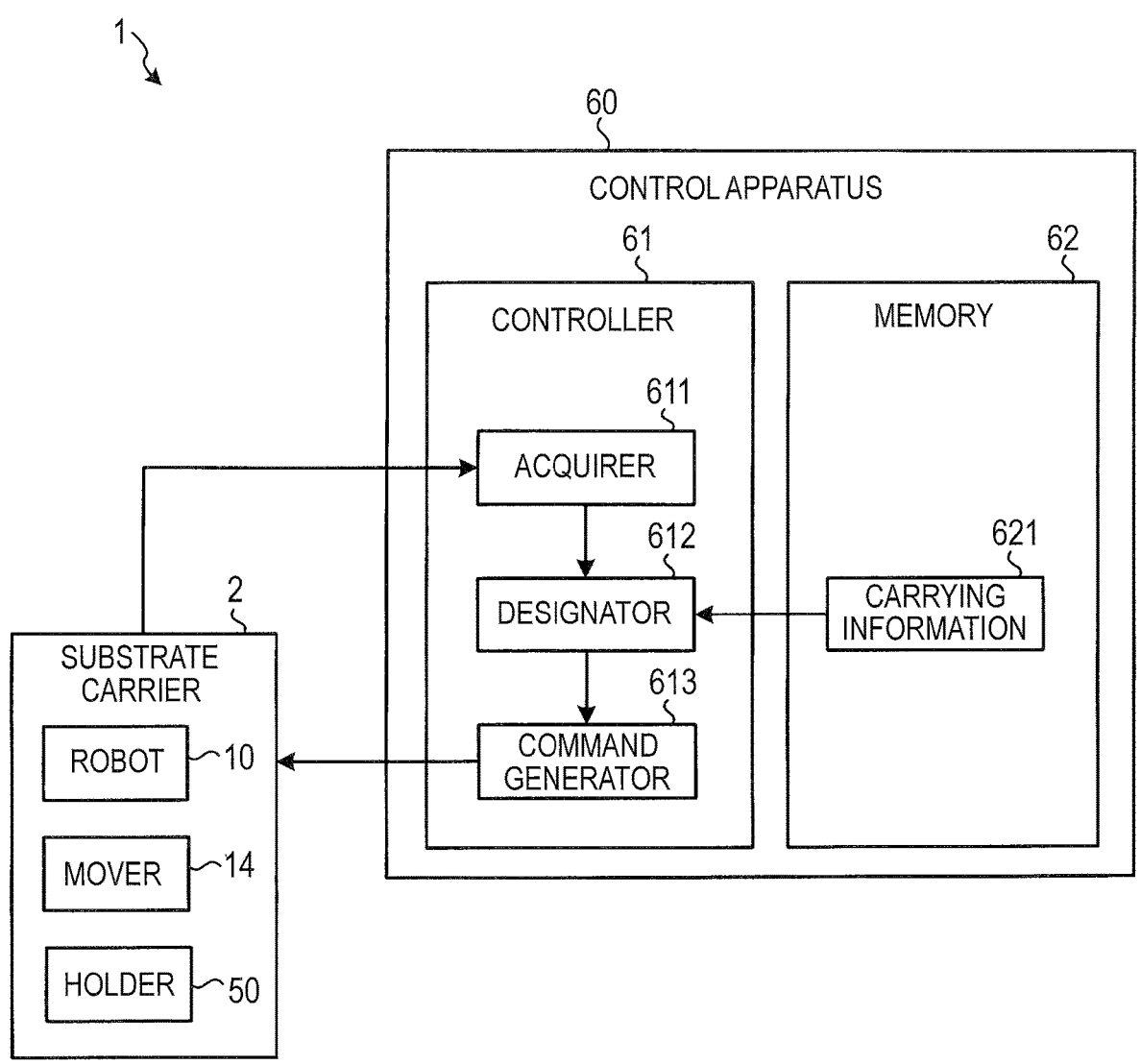
FIG. 4 is a block diagram of the robot system.

Next, a configuration of the robot system 1 according to the embodiment will be explained with FIG. 4. FIG. 4 is a block diagram of the robot system 1 according to the embodiment. In FIG. 4, the component elements necessary for explanation of the robot system 1 are illustrated, and the descriptions of the some component elements are omitted. Further, in the explanation with FIG. 4, the internal configuration of the control apparatus 60 will be mainly explained and the explanation of various apparatuses that have already explained in FIG. 2 may be omitted.

As shown in FIG. 4, the control apparatus 60 includes a controller 61 and a memory 62. The controller 61 further includes an acquirer 611, a designator 612, and a command generator 613. The memory 62 stores carrying information 621. The controller 61 performs overall control of the control apparatus 60.

The acquirer 611 acquires information containing positions and operation statuses of various apparatuses including the pair of hands 11 of the substrate carrier 2. Specifically, the acquirer 611 may acquire amount of expansion and contraction of the arm mechanism 12 and the elevation position and the turning position of the arm base 13b of the robot 10, the movement position of the robot 10 by the mover 14, and the operation status of the holder 50 etc.

The designator 612 sequentially designates the operations of the various apparatuses of the substrate carrier 2 from the information acquired in the acquirer 611. The designation is performed based on the carrying information 621. The carrying information 621 is information containing operation sequences of the various apparatuses including the substrate carrier 2 for carrying the wafers W and stored in the memory 62 in advance.

The command generator 613 generates operation signals for operating the various apparatus including the robot 10, the mover 14, and the holder 50 shown in FIG. 1 based on the information informed from the designator 612 and output the signals to the various apparatuses.

For example, the command generator 613 generates commands to the various apparatuses, such as for carrying the wafer W with the lower hand 11a shown in FIG. 1 from the hoop 30 to the holder 50, centering the wafer W in the holder 50, and carrying the wafer W with the upper hand 11b to the processing chamber 40h.

The memory 62 is a storage device such as a hard disc drive or non-volatile memory and stores the carrying information 621. The contents of the carrying information 621 have been already explained and the description is omitted here.

Note that, in the explanation with FIG. 4, the example in which the control apparatus 60 performs designation of the operation for the carrying the wafer W based on the carrying information 621 is shown, however, necessary information may be acquired as appropriate from a host apparatus (not shown) connected to the control apparatus 60 for communication with each other. In this case, the host apparatus may monitor the state of the substrate carrier 2 (and various component elements thereof) as appropriate.

Now, when the distance B between the pair of hands 11 is determined based on the height of the carrying destination of the wafer W such as the stage 41h of the processing chamber 40h and the table 51 (see FIG. 2) of the holder 50, the elevation stroke of the elevating mechanism (see FIG. 3A) of the base 13a may be made shorter. As below, the details of the distance B including the point will be explained with FIG. 5.

Figure 5:
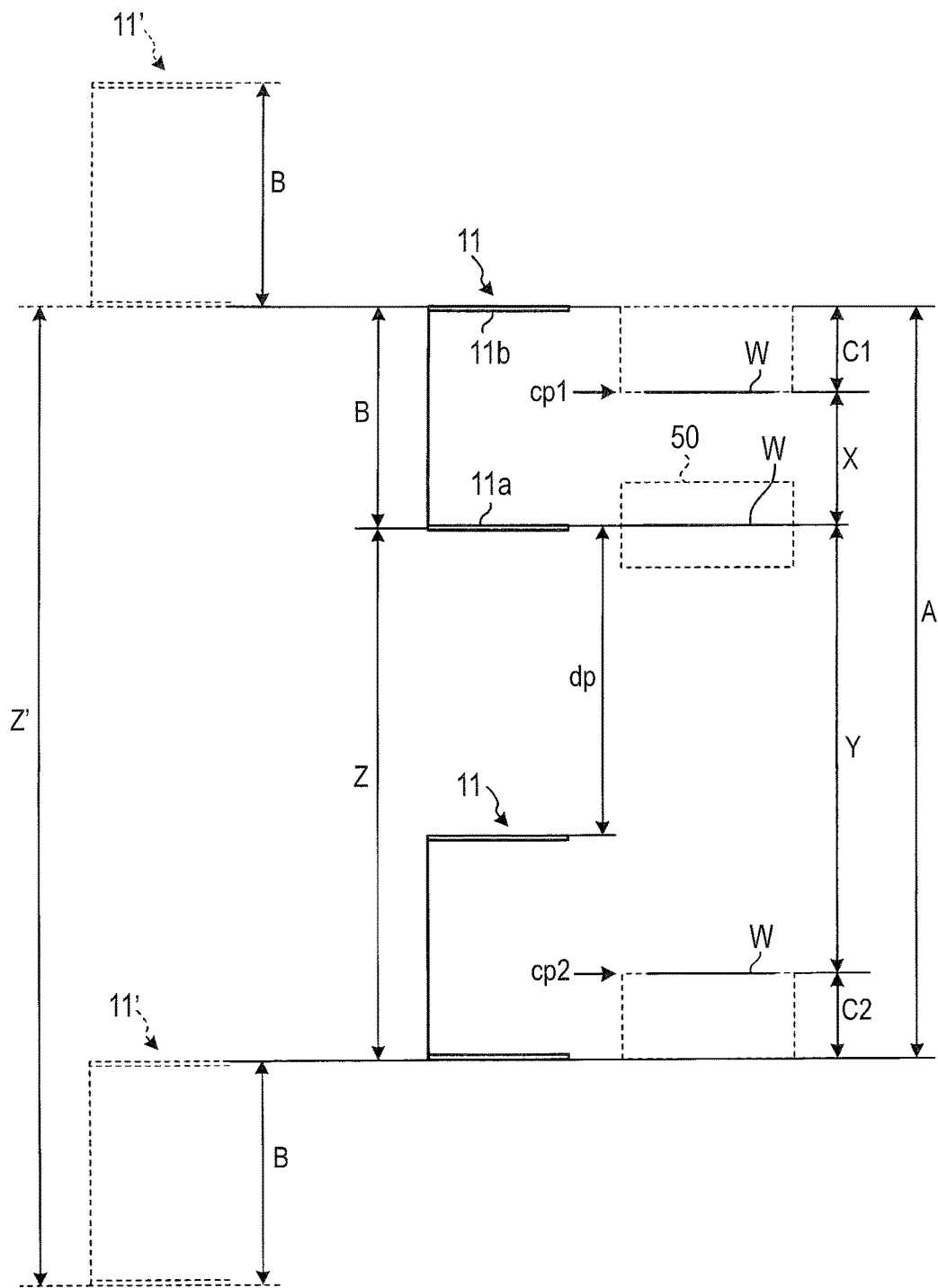
FIG. 5 is a schematic view showing a position relationship between the pair of hands and a carrying destination of a wafer in height directions.

FIG. 5 is a schematic view showing a position relationship between the pair of hands 11 and the carrying destination of the wafer in the height directions. FIG. 5 schematically shows the pair of hands 11 and the holder 50 located in the uppermost position and the lowermost position. Further, an example of the pair of hands 11 located in the uppermost position and the lower most position without the holder 50 is shown by dotted lines as a comparative example (see "pair of hands 11'" in FIG. 5).

First, the elevation range of the pair of hands 11 in the embodiment is explained. The pair of hands 11 move up and down with a stroke longer than the distance B between the pair of hands 11 (see "elevation distance Z" in FIG. 5) by the elevating mechanism of the base 13a (see FIG. 3A).

Thereby, "overlap range dp" in which the elevation ranges of the lower hand 11a and the upper hand 11b overlap may be provided. The holder 50 holds the wafer W in the overlap range dp. FIG. 5 shows the case where the holder 50 is provided to hold the wafer W in the upper end of the overlap range dp. However, the holder 50 may be provided to hold the wafer W in a position lower than the upper end of the overlap range dp by an amount of "access allowance" which will be described later.

Therefore, the pair of hands 11 can carry the wafer W to an arbitrary height via the holder 50 in the range between the lower hand 11a located in the lowermost position and the upper hand 11b located in the uppermost position (see "carrying range A" in FIG. 5).

Further, as shown in FIG. 5, the following expression (1) holds among the elevation distance Z of the pair of hands 11, the difference between the maximum height and the minimum height of the carrying destination of the wafer W (the distance of the carrying range A), and the distance B between the pair of hands 11.

$$Z = A - B \tag{1}$$

On the other hand, in the comparative example, when the wafer W is carried to an arbitrary height in the carrying range A by the respective pair of hands 11', the following expression (2) holds among an elevation distance Z' of the pair of hands 11', the difference between the maximum height and the minimum height of the carrying destination of the wafer W (the distance of the carrying range A), and the distance B.

$$Z'=A+B \qquad (2)$$

Therefore, according to the robot system 1 of the embodiment, the elevation stroke of the robot 10 (see FIG. 2) may be made smaller than that in the case without the holder 50. That is, in the case where the elevation strokes (the elevation distances Z and Z') are the same, the carrying range A of the wafer W may be expanded compared to the case not via the holder 50.

As shown in FIG. 5, the pair of hands 11 according to the embodiment move within the carrying range A, however, the pair of hands 11' in the comparative example move in a range formed by addition of the distances B on both sides of the carrying range A in the height directions.

In this case, the space corresponding to the outside of the carrying range A of the movement range of the pair of hands 11' becomes a space unavailable effectively for placement of equipment, the so-called dead space.

In other words, according to the robot system 1 of the embodiment, the wafer W can be carried without the dead space in the height directions. Therefore, space efficiency of the facility including downsizing of the housing 20 (see FIG. 2) may be improved.

Now, according to the embodiment, even in the case where the carrying range A of the wafer W and the position of the holder 50 are determined in advance, the distance B between the pair of hands 11 may be easily determined. As below, the point will be explained in detail.

First, "access allowance" according to the embodiment is explained. The access allowance refers to a distance in the upward and downward directions for the access operations of the respective pair of hands 11 to the wafer W. Specifically, in the embodiment, the respective pair of hands 11 move upward from immediately below the wafer W to hold to a fixed distance and mounts and holds the wafer in the middle of the movement.

Therefore, a distance in which the pair of hands 11 move is necessary in the upward and downward directions of the above described wafer W to be held. FIG. 5 shows the distance of the space on the upside of the wafer W in the height direction as "allowance distance C1" and the distance of the space on the downside in the height direction as "allowance distance C2".

The above described access allowance is changed as appropriate depending on the holding form of the wafer W by the pair of hands 11. For example, in the case where the respective pair of hands 11 suction and hold the wafer W from upside, it is not necessary to provide the allowance distance.

Subsequently, the method for determining the distance B between the pair of hands 11 is explained. First, assumingly, the access allowance on the upside of the carrying destination at the maximum height (see "carrying point cp1" in FIG. 5) is defined as the allowance distance C1 while the distance from the carrying destination to the wafer W held by the holder 50 in the height direction is defined as "first distance X", for instances.

Further, assumingly, the access allowance on the downside of the carrying destination at the minimum height (see "carrying point cp2" in FIG. 5) is defined as the allowance distance C2 while the distance from the carrying destination to the wafer W held by the holder 50 in the height direction is defined as "second distance Y", for instances. In the above described FIG. 2, the carrying point cp1 corresponds to the stage 41h of the processing chamber 40h and the carrying point cp2 corresponds to the lowermost stage of the hoop 30.

In this case, the distance B between the pair of hands 11 is determined by the following expression (3). Note that FIG. 5 shows the case where the distance B is equal to the sum of the allowance distance C1 and the first distance X (i.e., B=X+C1).

$$B=\min[(X+C1),(Y+C2)] \qquad (3)$$

As described above, according to the robot system 1 of the embodiment, the distance B between the pair of hands 11 may be easily set. Further, in this case, the elevation distance Z may be minimized with respect to the predetermined carrying range A of the wafer W and position of the holder 50.

Next, an example of a carrying method of the wafer W according to the embodiment will be explained with FIGS. 6A to 6D. FIGS. 6A to 6D are explanatory diagrams (part 1) to (part 4) for explanation of a series of motion of the robot 10 for carrying the wafer W.

In FIGS. 6A to 6D, the case where the wafer W is handed over from the lower hand 11a to the upper hand 11b through the processing of centering by the holder 50 (pre-aligner apparatus) is explained as an example.

Figure 6A:
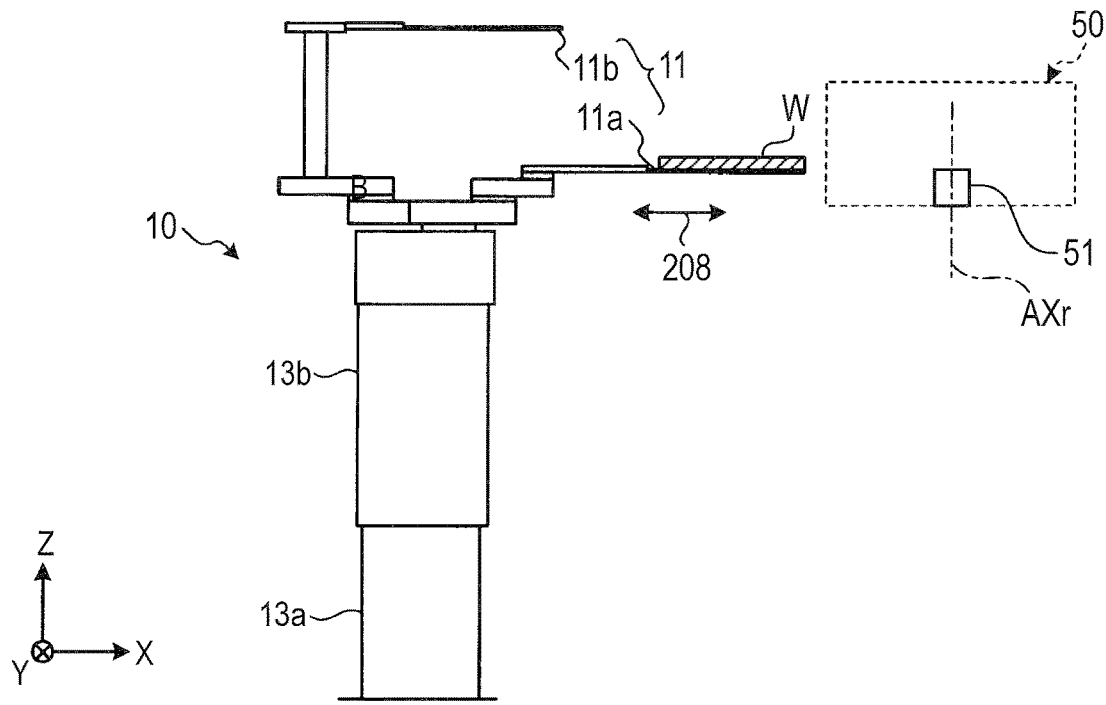
FIG. 6A is an explanatory diagram (part 1) for explanation of a series of motion of the robot for carrying the wafer.

First, as shown in FIG. 6A, for example, the lower hand 11a holds the wafer W at the height that can be reached by the lower hand 11a, and moves in the X-axis direction while moving in the positive direction of the Z-axis shown in the drawing and carries the wafer into the holder 50 (pre-aligner apparatus) (see an arrow 208 in FIG. 6A).

Figure 6B:
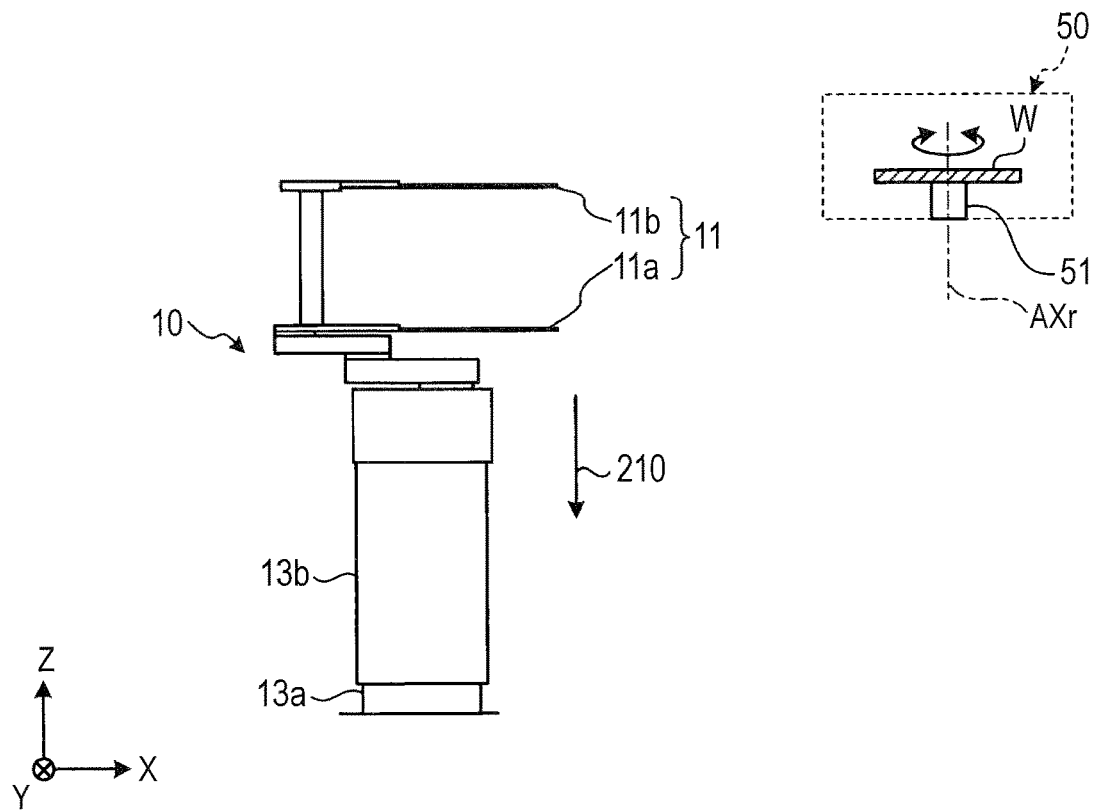
FIG. 6B is an explanatory diagram (part 2) for explanation of the series of motion of the robot for carrying the wafer.

Subsequently, as shown in FIG. 6B, the table 51 turns about the axis AXr and centers the wafer W (see a double-headed arrow about the axis AXr in FIG. 6B). Further, the upper hand 11b moves downward in the negative direction of the Z-axis shown in the drawing (see an arrow 210 in FIG. 6A).

It is preferable to move the upper hand 11b downward concurrently with the processing of the holder 50 including the above described centering of the wafer W. Thereby, the time taken for carrying the wafer W can be substantially shortened. Therefore, throughput of the wafer W may be improved.

Figure 6C:
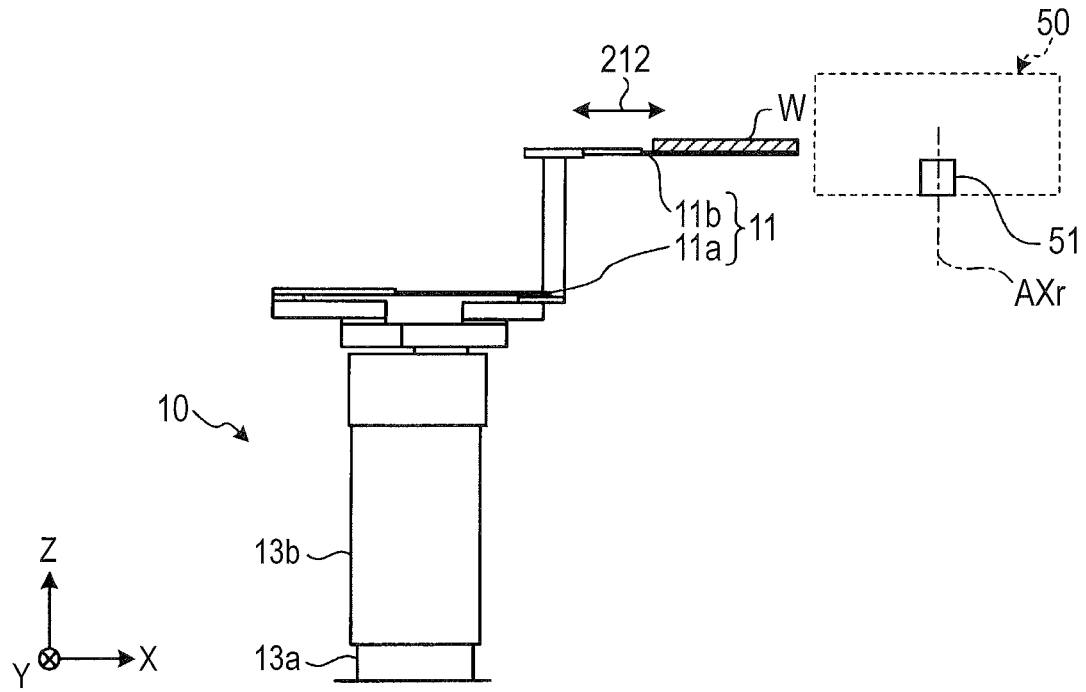
FIG. 6C is an explanatory diagram (part 3) for explanation of the series of motion of the robot for carrying the wafer.
Figure 6D:
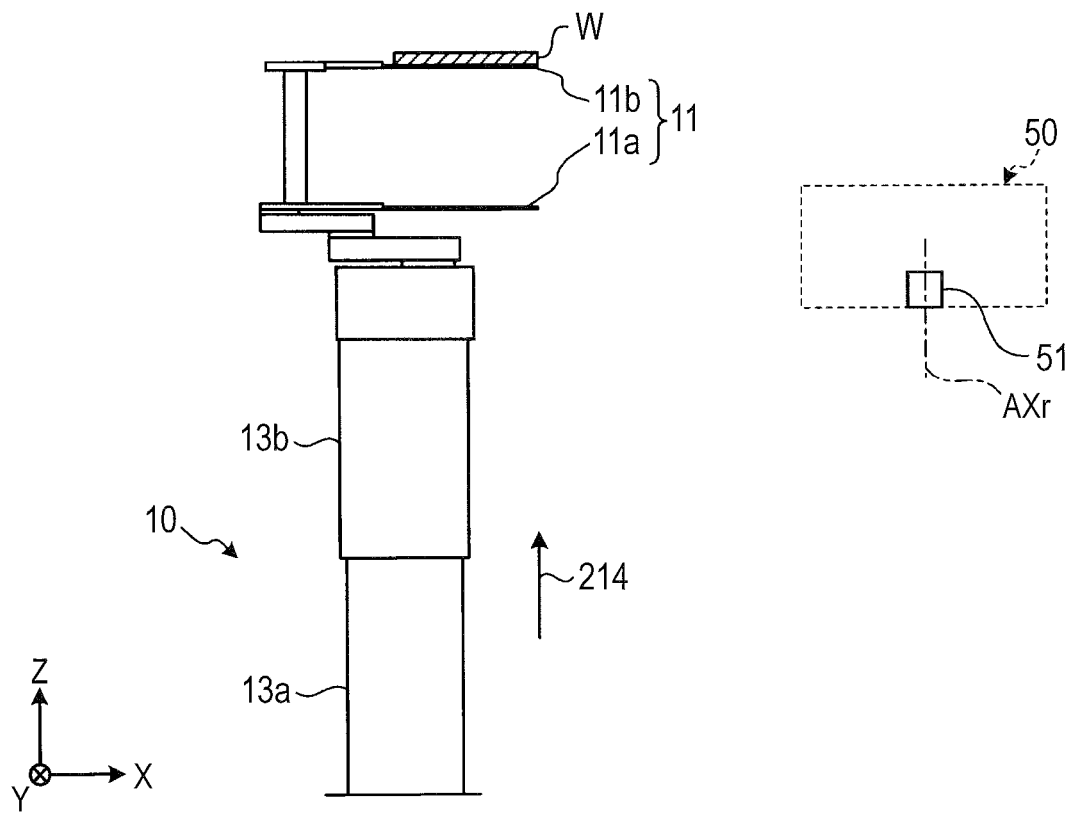
FIG. 6D is an explanatory diagram (part 4) for explanation of the series of motion of the robot for carrying the wafer.

As shown in FIG. 6C, when the processing of the holder 50 (centering of the wafer W) is completed, the upper hand 11b moves in the X-direction shown in the drawing and carries the wafer out of the holder 50 (see an arrow 212 in FIG. 6C). Then, as shown in FIG. 6D, the upper hand 11b carries the wafer W to the carrying destination that can be reached by the upper hand 11b while moving in the positive direction of the Z-axis shown in the drawing (see an arrow 214 in FIG. 6D).

Here, the case where the wafer W is handed over from the lower hand 11a to the upper hand 11b via the holder 50 is explained as an example. However, the wafer W may be handed over from the upper hand 11b to the lower hand 11a via the holder 50 instead.

Next, the processing procedures when the robot system 1 according to the embodiment performs handover of the wafer W between the pair of hands 11 will be explained with FIG. 7. In FIG. 7, the case where the wafer W held by the lower hand 11a is handed over to the upper hand 11b through the processing by the holder 50 will be explained as an example.

As shown in FIG. 7, one (lower hand 11a) of the pair of hands 11 holds the wafer W at the height that can be reached by the hand (lower hand 11a) (step S101), and carries the wafer W into the holder 50 (step S102). Step S102 may include moving up of the arm part 12.

Subsequently, the holder 50 performs predetermined processing on the wafer W (step S103) and the arm part 12 moves up or down (falls) (step S104). Step S103 and step S104 may be performed at the same time. In the case where the holder 50 is e.g. a buffer that holds the wafer W, step S103 may be omitted.

Then, the other (upper hand 11b) of the pair of hands 11 carries the wafer W out of the holder 50 (step S105) and carries the wafer W to a position that can be reached by the other of the pair of hands 11 (step S106), and the processing is ended.

As described above, a robot system according to an aspect of the embodiments includes a robot, a holder, and a control apparatus. The robot has arm mechanism supporting a pair of hands that can respectively hold a substrate at different heights and an elevator that moves up and down the arm mechanism in an elevation range larger than a difference between the heights of the hands.

The holder holds the substrate in an overlap range in which ranges reached by the hands overlap. The control apparatus performs control of handover of the substrate from one to the other of the hands via the holder while moving up and down the arm mechanism.

As described above, in the robot system according to the embodiment, the substrate is handed over between the pair of hands via the holder. Thereby, the elevation range of the elevator can be made smaller than an elevation range required for the handover without being performed via the holder. In other words, the carrying range of the substrate W can be expanded without increase of the elevation range of the elevator compared to the case not via the holder. Therefore, according to the robot system of the embodiment, space efficiency of the apparatus may be improved.

Note that, in the above described embodiments, the dual-arm robot is explained as an example, however, the embodiments may be applied to a multi-arm robot having two or more arms. Alternatively, a pair of hands may be provided in the distal end portion of one arm.

In the above described embodiments, the case where the respective pair of hands move along axis lines parallel to each other is explained as an example. However, as long as the pair of hands are at the different heights from each other, the respective hands may move along axis lines in different directions.

The above described embodiments are explained based on the case where one of pair of hands mounts or engages the substrate, while the other one of pair of hands holds the substrate. However, the pair of hands may hold the substrate in alternative manner such as gripping the substrate or chucking the substrate from above.

Still further, the above described embodiments are explained based on the case where the carrying destination of the substrate in the uppermost position is the stage of the processing chamber and the carrying destination (carrying source) in the lowermost position is the lowermost stage of the hoop is explained as an example. However, the carrying destination and the carrying source of the substrate may be determined in arbitrary locations in the range reached by the pair of hands instead.

In the above described embodiments, the housing having the nearly rectangular parallelepiped shape is explained as an example. However, as long as the housing has side walls, for example, an arbitrary shape such as a polygonal column shape or cylindrical shape may be employed.

In the above described embodiments, the case where the holder is fixedly provided is explained as an example. However, the holder may move up and down in the height directions by an elevating mechanism instead. In this case, the elevation range of the base and the distance between the pair of hands are determined based on the height of the holder (substrate) when the substrate is carried in and out. In this manner, the time taken for carrying the substrate may be further shortened.

Additional effects and modified examples may be easily derived by those skilled in the art. Accordingly, the wider aspect of the embodiments is not limited to the above shown and described particular details and representative embodiments. Therefore, various changes can be made without departing from the sprit or scope of the appended claims or the equivalents thereof.

It should be understood by those skilled in the art that various modifications, combinations, sub-combinations and alterations may occur depending on design requirements and other factors insofar as they are within the scope of the appended claims or the equivalents thereof.

What is claimed is:

1. A robot system comprising:
   a robot comprising:
      a holder provided at a first height in a height direction of the robot;
      a first hand configured to hold a first substrate at a second height lower than the first height in the height direction and to put the first substrate on the holder, and/or configured to hold a second substrate on the holder and to convey the second substrate to the second height;
      a second hand configured to hold the first substrate on the holder and to convey the first substrate to a third height higher than the first height in the height direction, and/or configured to hold the second substrate at the third height and to put the second substrate on the holder;
      an arm mechanism comprising:
         a lower arm mechanism supporting the first hand; and
         an upper arm mechanism supporting the second hand such that the second hand is provided to be higher than the first hand in the height direction to provide a height difference between the first hand and the second hand in the height direction; and
      an elevator to move the arm mechanism in the height direction within a moving range larger than the height difference; and
   circuitry configured to move the first hand to hold the first substrate at the second height and to put the first substrate on the holder and configured to move the second hand to hold the first substrate on the holder and to convey the first substrate to the third height, and/or the circuitry being configured to move the second hand to hold the second substrate at the third height and to put the second substrate on the holder and configured to move the first hand to hold the second substrate on the holder and to convey the second substrate to the second height.

2. The robot system according to claim 1, wherein the moving range of the elevator is substantially same as a value obtained by subtraction of the height difference from a difference between a maximum height and a minimum height of a carrying destination to which the substrate is carried by the robot.

3. The robot system according to claim 1,
wherein, letting a maximum height of a carrying destination to which the substrate is carried by the robot be a first height, a minimum height of the carrying destination be a second height, and an allowance value of the hand that accesses the first height in the height direction be a first allowance value, and when the holder is provided so that the substrate to hold may be at a height closer to the first height than the second height, and wherein the height difference is set to a sum of a value obtained by subtraction of the height of the substrate held by the holder from the first height and the first allowable value.

4. The robot system according to claim 1,
wherein, letting a maximum height of a carrying destination to which the substrate is carried by the robot be a first height, a minimum height of the carrying destination be a second height, and an allowance value of the hand that accesses the second height in the height direction be a second allowance value, and when the holder is provided so that the substrate to hold may be at a height closer to the second height than the first height, and wherein the height difference is set to a sum of a value obtained by subtraction of the second height from the height of the substrate held by the holder and the second allowable value.

5. The robot system according to claim 1, further comprising:
a locally cleaned housing that houses the robot therein; and
a mover to move the robot in a horizontal direction,
wherein the holder is provided closer to one of side walls of the housing, the side walls being opposed to each other in a direction in which the robot is moved by the mover.

6. The robot system according to claim 1, wherein the holder is an aligner apparatus to sense and align an orientation of the substrate.

7. The robot system according to claim 1, wherein the arm mechanism includes an arm supporting both the first hand and the second hand.

8. The robot system according to claim 1, wherein the arm mechanism comprises,
a first arm supporting the first hand, and
a second arm supporting the second hand.

9. The robot system according to claim 8, wherein the second arm supports the second hand via a coupling member which extends in the height direction to provide the height difference.

10. The robot system according to claim 9,
wherein the first arm and the second arm extend in a lateral direction perpendicular to the height direction.

11. The robot system according to claim 9,
wherein the coupling member is connected to a distal end portion of the second arm, and
wherein the second arm is rotatable around a rotational axis provided at a proximal end portion of the second arm which is opposite to the distal end portion.

12. The robot system according to claim 8, wherein the first arm supports the first hand via a coupling member which extends in the height direction to provide the height difference.

13. The robot system according to claim 12,
wherein the first arm and the second arm extend in a lateral direction perpendicular to the height direction.

14. The robot system according to claim 12,
wherein the coupling member is connected to a distal end portion of the first arm, and
wherein the first arm is rotatable around a rotational axis provided at a proximal end portion of the first arm which is opposite to the distal end portion.

* * * * *